(12) United States Patent
Nakazato et al.

(10) Patent No.: US 6,372,292 B1
(45) Date of Patent: Apr. 16, 2002

(54) INSULATING PASTE COMPOSITION FOR RIB FORMATION AND METHOD OF RIB PATTERN FORMULATION

(75) Inventors: Syunji Nakazato; Hiromitsu Sato; Hiroyuki Obiya, all of Kanagawa; Hiroyuki Nishimura, Tokyo, all of (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 09/526,605

(22) Filed: Mar. 16, 2000

(30) Foreign Application Priority Data

Mar. 17, 1999 (JP) .............................................. 11-071265

(51) Int. Cl.[7] .................................................. B05D 1/32
(52) U.S. Cl. ........................ 427/264; 427/272; 427/287
(58) Field of Search ............................. 427/163.2, 272, 427/264, 265, 287, 510, 518

(56) References Cited

U.S. PATENT DOCUMENTS 5,393,465 A * 2/1995 Drozdyk et al.
5,541,479 A * 7/1996 Nagakubo
6,043,604 A * 3/2000 Horiuchi et al.

FOREIGN PATENT DOCUMENTS

WO          98/01885    *   1/1998

* cited by examiner

Primary Examiner—Fred J. Parker
(74) Attorney, Agent, or Firm—Fish & Richardson P.C.

(57) ABSTRACT

An insulating paste composition for rib formation which comprises an insulating material, an organic binder, a light-absorbing substance, and an organic solvent. A rib pattern is formed by sandblasting an insulating layer formed of the composition using a lithographically formed resin pattern mask. The composition forms an antireflective insulating layer which can provide a rib pattern excellent in crosssectional contour and dimensional precision.

5 Claims, No Drawings

INSULATING PASTE COMPOSITION FOR RIB FORMATION AND METHOD OF RIB PATTERN FORMULATION

FIELD OF THE INVENTION

This invention relates to an insulating paste composition for forming ribs in the manufacture of various electronic displays and to a method of rib formation using the composition. More particularly, it relates to an insulating paste composition capable of forming a rib pattern excellent in dimensional precision and crosssectional contour and a method of rib pattern formation using the same.

BACKGROUND OF THE INVENTION

Production of various electronic displays, such as semiconductor or liquid crystal displays and plasma display panels, generally includes rib formation on a substrate to provide spacers between electrodes or cell partitions. Ribs are formed by, for example, a method comprising applying an insulating paste composition comprising an insulating material, an organic binder and an organic solvent directly to a substrate by screen printing or with a roll coater to form a rib pattern or a method comprising forming a green sheet of the insulating paste composition and transferring the green sheet onto the substrate. However, the conventional rib formation methods involve complicated steps and have great difficulty in forming an excellent rib pattern having rectangular crosssectional contour with high precision. Further, the methods are not suitable for forming a fine line pattern, failing to cope with the latest fine processing techniques. To solve this problem, a lithographic technique has been proposed, which comprises applying an insulating paste composition to a substrate to a desired thickness, forming thereon a pattern mask of a photosensitive resin, and removing the exposed area of the insulating paste composition layer as a protective mask by sandblasting. The problem associated with the known lithographic technique is that, where the insulating paste composition has a high reflectance, the dimensional precision of the lithographically formed pattern mask is adversely affected by the reflection of light at the insulating paste composition at the formation of the photosensitive resin pattern. The ribs formed by the lithographic technique have not only low dimensional precision but a poor crosssectional contour, which are particularly problematical in the production of plasma display panels (hereinafter "PDP") in which white ribs are formed for improving image brightness and have made it difficult to manufacture sufficiently practical PDP.

It has therefore been demanded to develop a method of producing PDP in which a rib pattern having an excellent contour and a high dimensional precision can be formed even with an insulating paste composition containing an insulating material having a high reflectance.

SUMMARY OF THE INVENTION

In the light of the above-mentioned circumstances, the present inventors have conducted extensive studies and found as a result that an insulating paste composition containing a light-absorbing substance provides a rib pattern with excellent contour and dimensional precision even where the composition comprises an insulating material having a high reflectance.

An object of the present invention is to provide an insulating paste composition which forms a rib pattern excellent in crosssectional contour and dimensional precision.

Another object of the invention is to provide a convenient method of forming a rib pattern excellent in crosssectional contour and dimensional precision.

The invention provides an insulating paste composition for rib formation which comprises an insulating material, an organic binder, a light-absorbing substance, and an organic solvent. The invention also provides a method of rib formation comprising using the insulating paste composition.

The rib-forming insulating paste composition of the present invention forms a rib-forming layer which prevents irregular reflection from the surface thereof when a photosensitive resin layer provided thereon is irradiated with active rays. As a result, the photosensitive resin layer is allowed to form a resin pattern having a rectangular crosssectional contour. Sandblasting the rib-forming layer using the resin pattern as a mask provides a rib pattern excellent in crosssectional contour and dimensional precision. The composition of the invention is especially effective in the formation of a white rib pattern having a high reflectance. Firing the rib pattern gives sharp and highly precise ribs.

According to the rib formation method of the invention, a rib pattern can be formed easily at a reduced production cost.

DETAILED DESCRIPTION OF THE INVENTION

The insulating material which can be used in the invention is made up of inorganic substances, such as $Al_2O_3$, $PbO$, $B_2O_3$, $SiO_2$, $ZnO$, $MgO$, and $SnO_2$. It is preferred to use low-melting glass powder that functions as a binder on firing in combination with these inorganic substances particularly where the rib formation involves a firing step as in the manufacture of PDP. The low-melting glass powder includes low-melting lead glass and low-melting zinc glass, whose softening points range approximately from 350 to 600° C. A combination of alumina powder and low-melting lead glass powder is a particularly preferred insulating material.

The organic binder and the organic solvent are used for making the insulating material into paste having film-forming properties. Any organic binders and solvents can be used as long as they are inert to the insulating material and burnt up on firing. Examples of suitable organic binders include cellulose series polymers, such as nitrocellulose, acetyl cellulose, ethyl cellulose, carboxymethyl cellulose, hydroxyethyl cellulose, hydroxypropyl cellulose, methyl cellulose, ethylhydroxy cellulose, and carboxymethylethyl cellulose; natural rubber, polybutadiene, chloroprene rubber, acrylic rubber, and isoprene synthetic rubbers, a natural high polymer such as a cyclized rubber, and a synthetic polymer such as polyethylene, polypropylene, polymethyl acrylate, polymethyl methacrylate, polystyrene, polyvinyl alcohol, polyvinyl butyral, polyvinyl acetate, polyester, polycarbonate, polyacrylonitrile, polyvinyl chloride, polyamine, and polyurethane. These polymers may be used either individually or a combination thereof, or in the form of copolymers.

The organic solvents are chosen from among those capable of uniformly dissolving or dispersing the selected organic binder. Examples of useful solvents are hydrocarbons, such as toluene and xylene; alcohols, such as methanol, ethanol, 2-propanol, and α-terpineol; ketones, such as acetone, methyl ethyl ketone, methyl isobutyl ketone, cyclohexanone, and isophorone; esters, such as methyl acetate, ethyl acetate, and butyl acetate; ethylene glycol ethers, such as ethylene glycol monomethyl ether, ethylene glycol monoethyl ether, ethylene glycol monobutyl ether, ethylene glycol monomethyl ether acetate, ethylene glycol monoethyl ether acetate, and ethylene glycol monobutyl ether acetate; and diethylene glycol ethers, such as diethylene glycol monomethyl ether, diethylene glycol monoethyl ether, diethylene glycol monobutyl ether, diethylene glycol monomethyl ether acetate, diethylene glycol monoethyl ether acetate, and diethylene glycol monobutyl ether acetate. These solvents may be used either individually or as a mixture of two or more thereof.

The light-absorbing substance which can be incorporated into the insulating paste composition includes dyes which absorb light used for exposing a photosensitive resin composition forming a pattern mask, i.e., the light within the sensitive wavelength region of the photosensitive component of the photosensitive resin composition, prevent generation of stationary waves or irregular reflection on the surface of the insulating paste composition layer formed, and have no adverse influences on the fluorescence characteristics of PDP. Dyes satisfying these requirements include benzophenone dyes, azo dyes, polyene dyes, quinoline dyes, aminoketone dyes, anthraquinone dyes, benzotriazole dyes, and cyanoacrylate dyes. Specific examples of suitable dyes are Crystal Violet (benzophenone dye produced by BASF), Oil Yellow 105 (azo dye produced by Orient Kagaku Kogyo K.K.), Diaresin Red G (anthraquinone dye produced by Mitubishi Chemical Corporation), Latyl Yellow 3G (quinoline dye produced by E.I. de Pont), and Duranol Brilliant Orange TG (aminoketone dye produced by ICI). These dyes may be used either individually or as a combination of two or more thereof.

The insulating paste composition of the invention may contain a plasticizer, if desired.

A preferred formulation of the insulating paste composition comprises 50 to 95% by weight of the insulating material, 0.5 to 15% by weight of the organic binder, 0.1 to 15% by weight of the light-absorbing substance, 1 to 50% by weight of the organic solvent, and from 0 up to 15% by weight of the plasticizer. If the amount of the light-absorbing substance is less than 0.1%, the effect on reflection prevention is insubstantial. If it exceeds 15%, too much light would be absorbed, making it difficult to form a satisfactory pattern.

Rib formation with the insulating paste composition of the present invention can be carried out, for example, as follows. The pasty composition is applied to a substrate, such as a glass plate, and dried to form a rib-forming layer. The rib-forming layer is coated with a photosensitive resin composition (hereinafter described in detail) followed by drying to form a photosensitive resin layer. The photosensitive resin layer may be formed by once forming a dry film having a photosensitive resin between a flexible supporting film and a release film, removing the release film, and adhering the dry film onto the rib-forming layer by pressing. The photosensitive resin layer is irradiated with active rays through a mask having a prescribed pattern and developed to form a resin pattern. The rib-forming layer of the exposed area is etched by sandblasting. Removal of the resin pattern with a remover containing sodium hydroxide, potassium hydroxide, periodic acid, sodium periodate, an organic alkali, etc., gives a rib pattern formed on the substrate. In the production of PDP, the rib pattern thus obtained is preferably fired at 500° C. or higher. Abrasives used for sandblasting include fine particles having a particle size of about 1 to 500 $\mu$m of glass beads, SiC, $SiO_2$, $Al_2O_3$, $ZrO_2$, organic plastics, and the like.

The photosensitive resin composition which can be used for resin pattern formation is not particularly limited as long as it is easily removable by firing or with are mover. For example, the photosensitive resin composition described in JP-A-9-127692 (the term "JP-A" as used herein means an unexamined published Japanese patent application) is preferred, which comprises a photopolymerizable urethane (meth)acrylate compound having at least two acryloyl or methacryloyl groups, an alkali-soluble polymer, and a photopolymerization initiator. The photopolymerizable urethane (meth)acrylate compound having at least two acryloyl or methacryloyl groups includes a reaction product obtained by the reaction between an isocyanate-terminated compound (obtainable by the reaction between a diol compound and a diisocyanate compound) and a (meth)acrylate compound having a hydroxyl group. In particular, a urethane acrylate having at least three urethane bonds per molecule is preferred. The alkali-soluble polymer includes acrylic acid resins, methacrylic acid resins, acrylic or methacrylic acid copolymers, and alkali-soluble cellulosic resins such as carboxymethyl cellulose and cellulose acetate phthalate. Comonomers of the acrylic acid or methacrylic acid copolymers include fumaric acid, maleic acid, crotonic acid, cinnamic acid, methyl acrylate, methyl methacrylate, ethyl acrylate, ethyl methacrylate, butyl acrylate, butyl methacrylate, isobutyl acrylate, isobutyl methacrylate, monomethyl fumarate, monoethyl fumarate, monopropyl fumarate, monomethyl maleate, monoethyl maleate, monopropyl maleate, and sorbic acid. Cellulose compounds obtained by the reaction between a partial acetic ester of cellulose and a di- or tricarboxylic acid, e.g., succinic acid, adipic acid or trimellitic acid, are also preferred.

The photopolymerization initiator includes benzophenone and its derivatives, such as 4,4'-bis(dimethylamino) benzophenone and 3,3-dimethyl-4-methoxybenzophenone; anthraquinone and its derivatives, such as 2-methylanthraquinone, 2-ethylanthraquinone, t-butylanthraquinone, and 1-chloroanthraquinone; benzoin and its alkyl ethers, such as benzoin methyl ether, benzoin ethyl ether, and benzoin propyl ether; acetophenone and its derivatives, such as 2,2-dimethoxy-2-phenylacetophenone, 2,2-diethoxyacetophenone, 2-hydroxy-2-methylpropiophenone, 4'-isopropyl-2-hydroxy-2-methylpropiophenone, and 2-methyl-1-[4-(methylthio) phenyl]-2-morpholino-1-propanone; thioxanthone derivatives, such as 2-chlorothioxanthone, diethylthioxanthone, isopropylthioxanthone, and diisopropylthioxanthone; benzil, 2,4,6-(trihalomethyl)-s-triazines, 2-(o-chlorophenyl)-4,5-diphenylimidazolyl dimer, 9-phenylacridine, 1,7-bis(9-acridinyl)heptane, 1,5-bis(9-acridinyl)pentane, 1,3-bis(9-acridinyl)propane, dimethylbenzyl ketal, trimethylbenzoyldiphenylphosphine oxide, tribromomethylphenyl sulfone, 2-benzyl-2-dimethylamino-1-(4-morpholinophenyl)-butan-1-one, and so forth. These photopolymerization initiators can be used either individually or as a combination of two or more thereof.

A preferred photosensitive resin composition comprises 50 to 90% by weight, based on the total composition, of the photopolymerizable urethane (meth)acrylate compound having at least two acryloyl or methacryloyl groups, 5 to 50% by weight, based on the total composition, of the alkali-soluble polymer, and 0.1 to 20% by weight, based on the total amount of the urethane (meth)acrylate and the alkali-soluble polymer, of the photopolymerization initiator.

The present invention will now be illustrated in greater detail with reference to Examples, but it should be understood that the invention is not construed as being limited thereto. Unless otherwise noted, all the parts and percents are by weight.

EXAMPLE 1

A rib-forming insulating paste composition was prepared from 100 parts of white low-melting glass frit containing PbO, 2 parts of ethyl cellulose, 5 parts of dibutyl phthalate (plasticizer), 20 parts of α-terpineol, and 5 parts of Oil Yellow 105 (azo dye available from Orient Kagaku Kogyo K.K.) by kneading in a three-roll mill.

The insulating paste composition was applied to a soda glass plate by screen printing and dried to form a rib-forming layer having a thickness of 150 μm. The rib-forming layer was laminated with a dry film resist of a photosensitive resin composition, ORDYL BF-703 supplied by Tokyo Ohka Kogyo Co., Ltd. The photosensitive resin film was exposed through a test mask to light from a 3.5 W ultrahigh pressure mercury lamp at an intensity of 200 mJ/cm$^2$ and spray-developed with a 0.2% sodium carbonate aqueous solution to provide a cured resin pattern. The resin pattern had a rectangular crosssectional contour with high sharpness and a high dimensional precision, showing a dimensional difference as small as 0.2 μm from the test mask.

The rib-forming layer thus exposed was etched by sandblasting with glass beads #800 (available from Toshiba Ballotini Co., Ltd.) to form a rib pattern faithful to the test mask pattern with a high dimensional precision and having a rectangular crosssectional contour. The substrate was immersed in a 12% monoethanolamine aqueous solution to remove the resin layer and fired at 520° C. The resulting substrate had no burnt residue, and the rib pattern showed high dimensional precision and an excellent contour.

EXAMPLE 2

A rib-forming insulating paste composition was prepared in the same manner as in Example 1, except for replacing Oil Yellow 105 with C.I. Acid Black 123 (succinate dye, available from Orient Kagaku Kogyo K.K.). The resulting paste composition was applied to soda glass and dried in the same manner as in Example 1 to form a rib-forming layer, and a resin pattern mask was formed thereon in the same manner as in Example 1. The resin pattern mask had a rectangular crosssectional contour with high sharpness and a high dimensional precision, showing a dimensional difference of 0.3 μm from the test mask.

The rib-forming layer thus exposed was etched by sandblasting, the resin layer was removed, and the substrate was fired at 520° C. in the same manner as in Example 1. The resulting substrate had no burnt residue, and the rib pattern showed a high dimensional precision and an excellent contour.

COMPARATIVE EXAMPLE 1

A resin pattern was formed in the same manner as in Example 1, except for omitting-Oil Yellow 105 from the rib-forming insulating paste composition. The resulting resin pattern had poor sharpness with a dimensional difference of 0.51 μm from the test mask.

While the invention has been described in detail and with reference to specific examples thereof, it will be apparent to one skilled in the art that various changes and modifications can be made therein without departing from the spirit and scope thereof.

What is claimed is:

1. A method of forming a rib pattern comprising coating a substrate with an insulating paste composition which comprises an insulating material, an organic binder, a light-absorbing substance, and an organic solvent, drying the paste composition to form a rib-forming insulating layer, forming a resin pattern on the rib-forming insulating layer by use of a photosensitive resin composition, and etching the insulating layer by sandblasting using the resin pattern as a mask.

2. The method of forming a rib pattern according to claim 1, wherein the insulating paste composition comprises 50 to 95% by weight of the insulating material, 0.5 to 15% by weight of the organic binder, 0.1 to 15% by weight of the light-absorbing substance, and 1 to 50% by weight of the organic solvent.

3. The method of forming a rib pattern according to claim 1, wherein the light-absorbing substance is at least one selected from the group consisting of benzophenone dyes, azo dyes, polyene dyes, quinoline dyes, aminoketone dyes, anthraquinone dyes, benzotriazole dyes, and cyanoacrylate dyes.

4. The method of forming a rib pattern according to claim 1, wherein the insulating material is at least one selected from the group consisting of Al$_2$O$_3$, PbO, B$_2$O$_3$, SiO$_2$, ZnO, MgO, and SnO$_2$.

5. The method of forming a rib pattern according to claim 4, wherein the insulating material further comprises a low-melting glass powder having a softening point of approximately from 350 to 600° C.

* * * * *